United States Patent
Li et al.

(10) Patent No.: US 9,563,589 B2
(45) Date of Patent: Feb. 7, 2017

(54) PICOBLAZE PROCESSOR BASED MULTIFUNCTION VEHICLE BUS (PMVB) CONTROLLER SYSTEM

(71) Applicant: Institute of Software, Chinese Academy of Sciences, Beijing (CN)

(72) Inventors: Mingshu Li, Beijing (CN); Chen Zhao, Beijing (CN); Bin Wu, Beijing (CN); Yuliang Bao, Beijing (CN); Liang Guo, Beijing (CN); Liyu Liu, Beijing (CN); Weiwei Hou, Beijing (CN); Jiachen Yu, Beijing (CN)

(73) Assignee: Institute of Software, Chinese Academy of Sciences, Beijing (CN)

( * ) Notice: Subject to any disclaimer, the term of this patent is extended or adjusted under 35 U.S.C. 154(b) by 157 days.

(21) Appl. No.: 14/434,037

(22) PCT Filed: Oct. 19, 2012

(86) PCT No.: PCT/CN2012/083210
§ 371 (c)(1),
(2) Date: Apr. 7, 2015

(87) PCT Pub. No.: WO2014/056249
PCT Pub. Date: Apr. 17, 2014

(65) Prior Publication Data
US 2015/0261703 A1    Sep. 17, 2015

(30) Foreign Application Priority Data
Oct. 11, 2012    (CN) .......................... 2012 1 0385096

(51) Int. Cl.
G06F 3/00        (2006.01)
G06F 13/32       (2006.01)
(Continued)

(52) U.S. Cl.
CPC ............. *G06F 13/32* (2013.01); *G06F 13/362* (2013.01); *G11C 7/1072* (2013.01); *H04L 12/40* (2013.01);
(Continued)

(58) Field of Classification Search
CPC ...................................................... G06F 13/32
(Continued)

(56) References Cited

U.S. PATENT DOCUMENTS 7,599,299 B2 * 10/2009 Goetting .......... G01R 31/31853
                                                       327/371
9,379,775 B2 *  6/2016 Cooper ..................... H04B 3/54
(Continued)

OTHER PUBLICATIONS

Kirrmann, "Train Communication Network IEC 61375-3 Multifunction Vehicle Bus", Ecole Polytechnique Federale Lausanne, Jan. 20, 1999, pp. 1-67.*
(Continued)

Primary Examiner — Tammara Peyton
(74) Attorney, Agent, or Firm — SV Patent Service

(57) ABSTRACT

The present invention relates to the field of communications on rail trains. A PicoBlaze-based MVB controller includes a pMVB controller, a traffic memory, an ARM adapter, and a bus arbiter. The pMVB controller, the traffic memory, ARM adapter, and the bus arbiter are connected to an external bus BUS1. The pMVB controller is connected to the traffic memory. The ARM adapter is connected to an external ARM processor and the bus arbiter. The traffic memory can store network communication data and input control information, and send them to the pMVB controller. The pMVB controller responds to the control information, and sends the communication data, and after it is encoded, to the MVB bus via the external bus BUS1. The pMVB controller also decodes data received from the pMVB bus and triggers an interrupt. The bus arbiter is responsible for bus arbitration in accordance with the instructions from the pMVB controller.

5 Claims, 2 Drawing Sheets

(51) Int. Cl.
*H04L 12/40* (2006.01)
*G06F 13/362* (2006.01)
*G11C 7/10* (2006.01)
*B61L 15/00* (2006.01)

(52) U.S. Cl.
CPC .. *B61L 15/0036* (2013.01); *H04L 2012/40293* (2013.01)

(58) Field of Classification Search
USPC ......................................................... 710/113
See application file for complete search history.

(56) References Cited

U.S. PATENT DOCUMENTS

| | | | | |
|---|---|---|---|---|
| 2011/0307734 A1* | 12/2011 | Boesen | ..................... | G06F 8/31 714/3 |
| 2015/0237156 A1* | 8/2015 | Zhao | ..................... | H04L 67/10 709/201 |

OTHER PUBLICATIONS

Ken Chapman; XAPP627 (v1.1); "PicoBlaze 8-Bit Microcontroller for Virtex-II Series Devices"; Feb. 4, 2003; available from Xilinx, Inc., 2100 Logic Drive, San Jose, California 95124; pp. 1-44.*

* cited by examiner

PICOBLAZE PROCESSOR BASED MULTIFUNCTION VEHICLE BUS (PMVB) CONTROLLER SYSTEM

TECHNICAL FIELD

The present invention relates to the field of rail train communications, and in particular to a PicoBlaze-based Multifunction Vehicle Bus (MVB) controller, which is a core technology component for communication devices compatible with TCN network communications standard.

BACKGROUND OF THE INVENTION

Multifunction Vehicle Bus Controller (MVBC) is a new generation core processor for MVB buses. MVBC is independent of the physical layer and functional equipment, and provides communication interfaces and services for devices on the bus.

Current vehicle communication equipment in train communication network (TCN) mainly MVB network cards and other devices, which are usually implemented using Siemens MVBCS1 chip (MVB controller) or by programming with MVBC Verilog control logic. Since Siemens MVBCS1 chips are monopolized by a foreign company, domestically there is no relevant ASIC to Siemens MVBCS1 chip. Programming using Verilog MVBC control logic is too complex and its implementation varying from engineer to engineer; this approach cannot guarantee real-time performance and reliability.

The conventional equipment include the following main drawbacks: (1) their core technology is dependent on monopolized foreign technologies, and cannot be localized; (2) their implementation requires software development; the control logic is complex, and their development is challenging; and (3) the processing efficiency using Verilog MVBC control logic is much lower than dedicated controller chips.

SUMMARY OF THE INVENTION

General aspects of the present invention can include one or more of the following:

An Multifunction Vehicle Bus (MVB) controller can include a pMVB controller, a traffic memory, an ARM adapter and a bus arbiter, wherein the pMVB controller, the traffic memory, the ARM adapter, the bus arbiter can be respectively connected to an external bus BUS1, wherein the pMVB controller can be connected to the traffic memory, wherein the ARM adapter is respectively connected to an external ARM processor and the bus arbiter.

The traffic memory can store network traffic data and input control information and send the network traffic data and input control information to the pMVB controller.

The pMVB controller can respond to the control information, to encode the traffic data and then to send the encoded traffic data via the external bus BUS1 onto a MVB bus, wherein the pMVB controller is configured to decode received encoded traffic data and to trigger an interrupt and to perform corresponding interrupt processing.

The bus arbiter can perform bus arbitration according to an instruction sent by the pMVB controller, and to ensure that only one processor is able to access the traffic memory at each time.

The ARM adapter can be used as an agent for the external ARM processor to access the traffic memory and to respond to arbitration assignment of the bus arbiter.

The pMVB controller can include an on-chip PicoBlaze processor, a bus controller, a remote call interrupt generator, a data swap area DRAM, an encoder, a decoder, an interrupt controller, and a timer, wherein the timer is connected to an internal bus BUS0 and the interrupt controller, wherein the data swap area DRAM is respectively connected to the internal bus BUS0 and the external bus BUS1, and the remote call interrupt generator is connected to the internal bus BUS0.

The on-chip PicoBlaze processor can be connected to the bus controller and is configured to process a state or control instruction data inside the bus controller according to input control information, and to perform interrupt processing in response to an interrupt signal generated from the internal interrupt controller.

wherein the bus controller can be connected to the internal bus BUS0 and the external bus BUS1, and can manage the on-chip PicoBlaze processor, the internal bus BUS0 and the external bus BUS1, and to switch a control right of the on-chip PicoBlaze processor and the external ARM processor over the internal bus BUS0 and the external bus BUS1.

The remote call interrupt generator can control the communication between the traffic memory and the external ARM processor.

The encoder can be connected to the internal bus BUS0, and is configured to perform Manchester coding on MVB data.

The decoder can be connected to the internal bus BUS0 and the interrupt controller, and is configured to decode the MVB data and to trigger to an interrupt control signal.

The interrupt controller can be connected to the on-chip PicoBlaze processor, and configured to report the interrupt control signal to the on-chip PicoBlaze processor.

The pMVB controller can further include a buffer RAM used for operations of the on-chip PicoBlaze processor, wherein the buffer RAM is connected to the internal bus BUS0.

The on-the on-chip PicoBlaze processor can be a Xilinx's 8-bit PicoBlaze processor.

The traffic memory can use Page mechanism for the procedure data source port and to use Disable mechanism for the procedure data sink port.

DETAILED DESCRIPTION OF THE INVENTION

Figure 1:
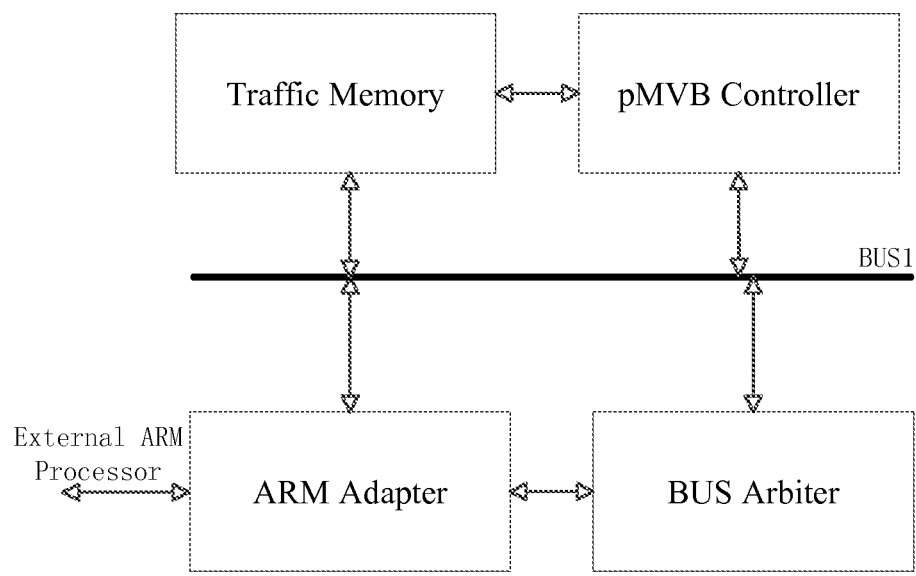
FIG. 1 is a framework diagram for a MVB controller module in accordance with the present invention.

In view of the above-described technical problems in conventional technologies, the object of the present invention is to provide a PicoBlaze-based MVB controller, which is mainly composed of four modules, shown in FIG. 1, a pMVB Controller, an ARM Adapter, a Traffic Memory, and a Bus Arbiter.

As shown in FIG. 1, a pMVB controller (i.e. the core of a miniature vehicle bus controller, and the core of a MVB controller), connected to the Traffic Memory, is responsible for encoding and decoding processing data on the MVB. The pMVB controller is also responsible for the communications and associated controls between an external ARM processor and the Traffic Memory. The control information is usually input by users. The Traffic Memory (communication memory) is used to store network traffic data and externally input control information. The Traffic Memory is respectively connected to the pMVB controller and an external bus BUS1. The Traffic Memory is respectively connected to the ARM Adapter via BUS1 to exchange data with the external ARM processor. The ARM Adapter is connected to the external ARM processor. The ARM Adapter acts as an agent for the access to the Traffic Memory by the external ARM processor, and is subject to arbitration distribution of the BUS Arbiter. The Bus Arbiter is connected to the external bus BUS1 and the ARM Adapter, and is responsible for bus arbitration. Bus Arbiter ensures that at each time, only one processor can access the Traffic Memory.

Figure 2:
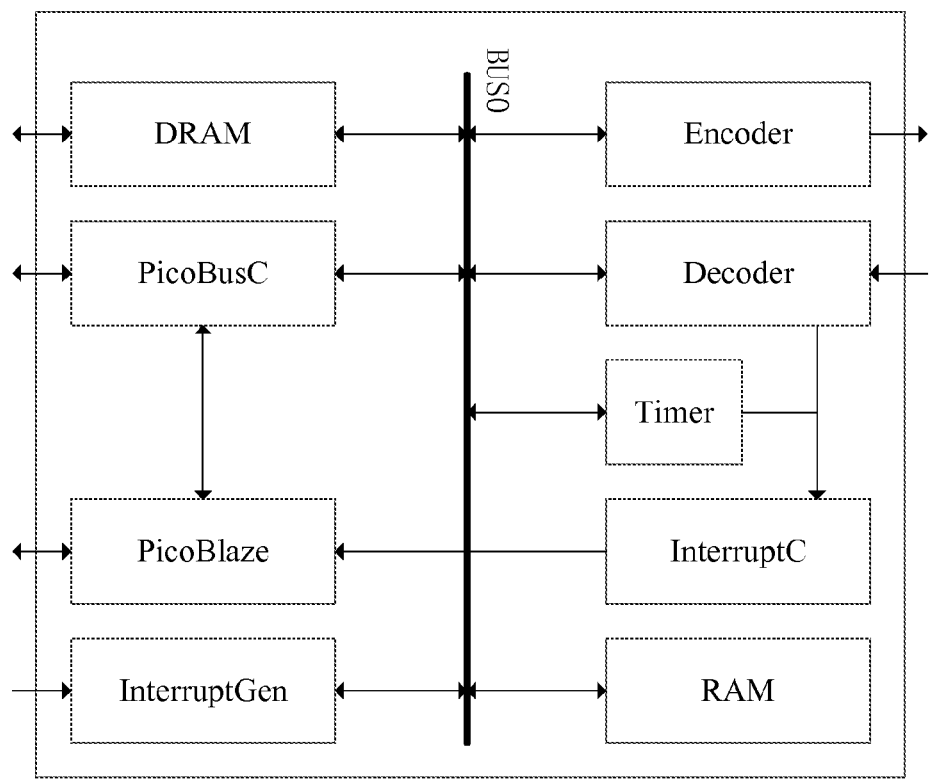
FIG. 2 is a structure diagram of a pMVB controller in accordance with the present invention.

The structure diagram of the presently disclosed pMVB controller is shown in FIG. 2. The pMVB controller module includes an 8-bit on-chip Xilinx PicoBlaze processor, a bus controller PicoBusC, a remote call interrupt generator InterruptGen for communication with the external ARM processor, and a data swap area DRAM. The pMVB controller module also includes an Encoder related to the MVB, a Decoder, an interrupt controller InterruptC, and a RAM for running PicoBlaze programs. The PicoBlaze processor is connected to the PicoBusC controller. The PicoBlaze processor processes the internal status of the PicoBusC controller and control command data based on control information input by users. The PicoBlaze processor also executes interrupt operation in response to the interrupt signal from the interrupt controller InterruptC. The PicoBusC controller is connected to with on-chip PicoBlaze processor, the internal bus BUS0, the external bus BUS1. The PicoBusC controller manages the on-chip PicoBlaze processor, the internal bus (BUS0), and the external bus (BUS1), namely, it switches bus controls by different modules. The data swap area DRAM and remote call interrupt generator InterruptGen are respectively connected to the internal bus (BUS0). The remote call interrupt generator InterruptGen is used for controlling the communications between the Traffic Memory and the external ARM processor. The Encoder is connected to the internal bus, for performing Manchester coding on MVB data. The decoder is connected to the internal bus and the interrupt controller InterruptC and can decode MVB data and trigger an interrupt. The Timer is connected to the internal bus and the interrupt controller InterruptC; the interrupt controller InterruptC is connected to the on-chip PicoBlaze processor is used for interrupting response. The RAM is used for running programs of the on-chip PicoBlaze processor.

The bus controller PicoBusC is configured to control off-chip and on-chip buses (i.e. BUS0 and BUS1) according to instructions sent by the on-chip PicoBlaze processor. The control information and traffic data are transmitted to the pMVB Controller by users via the Traffic Memory. The pMVB controller performs relevant processing tasks according to the control information, and writes the traffic data into the Encoder for data encoding. After the data encoding is completed, the data is sent onto an MVB bus via BUS1. Meanwhile the pMVB controller monitors the MVB bus. The received MVB bus data is decoded by the Decoder and an interrupt is triggered. An interrupt control signal is reported by the internal interrupt controller InterruptC to the on-chip PicoBlaze processor. Then the on-chip PicoBlaze processor enters into data processing in a corresponding interrupt procedure.

The PicoBlaze processor is connected to the PicoBusC controller. The internal modules are connected with on internal 8-bit buses and are consistently managed by the PicoBusC controller. The external buses are connected to the PicoBusC to allow the external ARM processor to obtain the information on the internal buses during debugging. Further details about the external ARM processor will not be elaborated because it is not the focus of the present disclosure.

Conventional MVB controllers are developed by using Verilog, which results in overly large development project, and complex transitions in a state machine, and is thus difficult to comprehend and maintain. Some MVB controllers are developed by using single processors, but because a lack of hardware acceleration modules (a codec), they demonstrate inferior performance in real-time responses. The presently disclosed system and method divide conventional Verilog logic development and PicoBlaze software development into two parts: the codec that has high real-time performance requirement is implemented by using Verilog; and the complex state machine is implemented by using software. The difficulty of MVB controller development is thus reduced. The pMVB Controller module allows the disclosed system and method to have increased processing and real-time performances comparing to the traditional single processors.

The present invention has the following advantages compared with the conventional technologies:

The present invention greatly reduces the difficulty and time for developing TCN network communication equipment for the users, and saves the cost. The disclosed system and methods have high operating efficiency, high real-time performance and reliability, and can break technology monopoly, and realize localization of core technologies. The present invention is applicable to the control and management and train communication network, and is also applicable to the fields of railway trains or industrial automation.

DETAILED IMPLEMENTATIONS

The introduction of the modules are given as follows:
On-chip PicoBlaze3 processor
A Xilinx PicoBlaze3 processor is used to control and process MVB bus data.
ARM Adapter
ARM Adapter is an adapter for ARM, which includes an InterruptC, can reuse Interrupt 1 (that is, the interrupt provided to an external processor) to support vector and data mask. ARM Adapter needs to make a request for BUS Arbiter simultaneous access to access the Traffic Memory. The timing of the request is at the falling edge of the ARM RE/WE.
InterruptC internal interrupt controller
The internal interrupt controller supports 16 input signals and is connected to the on-chip PicoBlaze processor, a decoder, and a timer.
InterruptGen remote call interrupt generator
It is configured to trigger an off-chip ARM7TDMI processor to interrupt.
PicoBusC bus controller
PicoBusC is used for switching between an 8-bit address bus (in 8-bit direct access mode) and 20-bit address bus (in DMA mode). Using DBGIO PicoBusC can switch control right to the bus for the on-chip PicoBlaze processor and the external ARM processor.
BUS0 & BUS1 bus
BUS0 is a bus that connects internal modules of the pMVB controller. BUS1 is a bus that connects Traffic Memory, and is used for data exchanges between internal and external data buses.

Bus Arbiter

The bus arbiter arbitrates access right to the Traffic Memory. Because the internal timing sequences are relatively stable, BUS Arbiter directly uses combinational logic to produce a judgment signal. For example, the judgment signal can be generated according to determination on priority (combinational logic).

ARM cannot directly access the Traffic Memory; it needs to be through the ARM Adapter, so that its access can be controlled by the Bus Arbiter. Meanwhile DMA implementation must allow "pause" function.

Timer

It is used for timing frames and cycles, and is connected with the interrupt controller InterruptC.

Encoder

It is implemented by a Manchester encoder connected to the internal bus.

Decoder

It is implemented by a Manchester decoder connected with the InterruptC interrupt controller.

Traffic Memory (TM)

TM can be addressed using a total range of 2 Mb, currently using only 1 Mb in low address space as much as possible. Moreover, the procedure data source port (Source) is based on Page mechanism (i.e., memory Page mechanism) is used. The procedure data sink port (Sink) uses disable mechanism. (Disable mechanism is also a Page mechanism with the exception that when the Page is set by the ARM, it is equivalent to disabled). It is connected to the pMVB controller and the internal bus BUS0.

DRAM & RAM:

The address 0x00-0x5F in the DRAM can be accessed by the Traffic Memory to enable interactions between the on-chip PicoBlaze processor and the external ARM processor. The DRAM is connected to the external bus (BUS1) and the internal bus (BUS0).

The address 0x60-x7F in the RAM can only be accessed by the on-chip PicoBlaze processor to buffer the data. The RAM is connected to the internal bus (BUS0).

Although the present invention is disclosed as above, it is not used to limit the present invention, any technical personnel of the technical field, within the spirit and scope of the present invention, can make arbitrary changes or equivalent replacement, so the protection scope of the present invention should be the scope defined by the claims of this application.

While this document contains many specifics, these should not be construed as limitations on the scope of an invention that is claimed or of what can be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or a variation of a sub-combination.

What is claimed is:

1. An Multifunction Vehicle Bus (MVB) controller, comprising:

a pMVB controller, a traffic memory, an ARM adapter and a bus arbiter, wherein the pMVB controller, the traffic memory, the ARM adapter, the bus arbiter are respectively connected to an external bus BUS1, wherein the pMVB controller is connected to the traffic memory, wherein the ARM adapter is respectively connected to an external ARM processor and the bus arbiter, wherein the traffic memory is configured to store network traffic data and input control information and send the network traffic data and input control information to the pMVB controller, wherein the pMVB controller is configured to respond to the control information, to encode the traffic data and then to send the encoded traffic data via the external bus BUS1 onto a MVB bus, wherein the pMVB controller is configured to decode received encoded traffic data and to trigger an interrupt and to perform corresponding interrupt processing, wherein the bus arbiter is configured to perform bus arbitration according to an instruction sent by the pMVB controller, and to ensure that only one processor is able to access the traffic memory at each time, and wherein the ARM adapter is used as an agent for the external ARM processor to access the traffic memory and to respond to arbitration assignment of the bus arbiter.

2. The MVB controller in claim 1, wherein the pMVB controller includes an on-chip PicoBlaze processor, a bus controller, a remote call interrupt generator, a data swap area DRAM, an encoder, a decoder, an interrupt controller, and a timer, wherein the timer is connected to an internal bus BUS0 and the interrupt controller, wherein the data swap area DRAM is respectively connected to the internal bus BUS0 and the external bus BUS1, and the remote call interrupt generator is connected to the internal bus BUS0, wherein the on-chip PicoBlaze processor is connected to the bus controller and is configured to process a state or control instruction data inside the bus controller according to an input control information, and to perform interrupt processing in response to an interrupt signal generated from the internal interrupt controller, wherein the bus controller is connected to the internal bus BUS0 and the external bus BUS1, and is configured to manage the on-chip PicoBlaze processor, the internal bus BUS0 and the external bus BUS1, and to switch a control right of the on-chip PicoBlaze processor and the external ARM processor over the internal bus BUS0 and the external bus BUS1, wherein the remote call interrupt generator is configured to control the communication between the traffic memory and the external ARM processor, wherein the encoder is connected to the internal bus BUS0, and is configured to perform Manchester coding on MVB data, wherein the decoder is connected to the internal bus BUS0 and the interrupt controller, and is configured to decode the MVB data and to trigger to an interrupt control signal, and wherein the interrupt controller is connected to the on-chip PicoBlaze processor, and configured to report the interrupt control signal to the on-chip PicoBlaze processor.

3. The MVB controller in claim 2, wherein the pMVB controller further includes a buffer RAM used for operations of the on-chip PicoBlaze processor, wherein the buffer RAM is connected to the internal bus BUS0.

4. The MVB controller in claim 2, wherein the on-chip PicoBlaze processor is a Xilinx's 8-bit PicoBlaze processor.

5. The MVB controller in claim 1, wherein the traffic memory is configured to use Page mechanism for the procedure data source port and to use Disable mechanism for the procedure data sink port.

\* \* \* \* \*